US010416195B2

(12) United States Patent
Hurwitz et al.

(10) Patent No.: US 10,416,195 B2
(45) Date of Patent: Sep. 17, 2019

(54) CURRENT SENSOR AND A METHOD OF MANUFACTURING A CURRENT SENSOR

(71) Applicant: Analog Devices Global, Hamilton (BM)

(72) Inventors: Jonathan Ephraim David Hurwitz, Edinburgh (GB); David S. Yaney, Poolesville, MD (US); Petre Minciunescu, North Andover, MA (US); David P. Smith, Pembroke, MA (US)

(73) Assignee: Analog Devices Global, Hamilton (BM)

( * ) Notice: Subject to any disclaimer, the term of this patent is extended or adjusted under 35 U.S.C. 154(b) by 142 days.

(21) Appl. No.: 15/179,249

(22) Filed: Jun. 10, 2016

(65) Prior Publication Data

US 2017/0356934 A1   Dec. 14, 2017

(51) Int. Cl.
*G01R 15/18* (2006.01)
*G01R 19/00* (2006.01)

(52) U.S. Cl.
CPC ....... *G01R 15/181* (2013.01); *G01R 19/0092* (2013.01)

(58) Field of Classification Search
CPC . G01R 1/20; G01R 1/22; G01R 1/203; G01R 15/146; G01R 19/0007; G01R 15/181; G01R 19/0092

(Continued)

(56) References Cited

U.S. PATENT DOCUMENTS 6,313,623 B1  11/2001  Kojovic et al.
6,414,475 B1   7/2002  Dames et al.
(Continued)

FOREIGN PATENT DOCUMENTS

DE  102007046054 A1  4/2008
EP      1183543 A1   3/2002
(Continued)

OTHER PUBLICATIONS

Murgatroyd, P. N., et al., "Geometrical Properties of Rogowski Senors", *IEEE Colloquium on Low Frequency Power Measurement and Analysis*, (1994), 10 pgs.

(Continued)

*Primary Examiner* — Tung X Nguyen
*Assistant Examiner* — Robert P Alejnikov, Jr.
(74) *Attorney, Agent, or Firm* — Schwegman Lundberg & Woessner, P.A.

(57) ABSTRACT

The present disclosure provides an improved Rogowski-type current sensor. In order to allow the sensing coil and the compensation wire to overlap, the sensor is produced using two boards. The current sensing coil is provided on one board, and the compensation wire is provided on another board. The coil and the wire are arranged such that they at least partially overlap, and ideally the compensation wire is formed entirely within the area defined by the coil, albeit in a different plane. This arrangement makes the current sensor far better at rejecting interference than prior art PCB arrangements. In addition, the coil may be formed on a two-sided board. The board has upper radial elements formed on an upper surface, and lower radial elements formed on lower surface. The radial elements are connected using vias formed in the board. The upper radial elements are arranged in a first plane, and the lower radial elements are formed in a second parallel plane. The upper radial (Continued)

elements are arranged so that they are aligned with the lower radial elements, such that a pair of radial elements form a radial plane that is perpendicular to the board surface. This symmetry ensures excellent sensitivity to currents in a conductor.

20 Claims, 18 Drawing Sheets

(58) Field of Classification Search
USPC .................................................. 324/127, 126
See application file for complete search history.

(56) References Cited

U.S. PATENT DOCUMENTS

| | | | |
|---|---|---|---|
| 6,624,624 B1* | 9/2003 | Karrer | G01R 15/181 324/117 R |
| 6,677,850 B2 | 1/2004 | Dames | |
| 6,734,661 B2 | 5/2004 | Colby et al. | |
| 7,227,442 B2 | 6/2007 | Skendzic | |
| 7,307,410 B2 | 12/2007 | Shiokawa et al. | |
| 7,902,812 B2 | 3/2011 | Kojovic | |
| 8,890,509 B2 | 11/2014 | Dames et al. | |
| 2004/0178875 A1* | 9/2004 | Saito | G01R 15/181 336/200 |
| 2007/0114992 A1* | 5/2007 | Muniraju | G01R 15/207 324/225 |
| 2007/0152651 A1* | 7/2007 | Shiokawa | G01R 15/181 324/76.11 |
| 2009/0230948 A1* | 9/2009 | Kojovic | G01R 15/181 324/117 R |
| 2014/0266269 A1* | 9/2014 | Ausserlechner | G01R 1/203 324/713 |
| 2017/0356935 A1 | 12/2017 | Hurwitz | |

FOREIGN PATENT DOCUMENTS

| | | |
|---|---|---|
| EP | 1183543 B1 | 4/2003 |
| EP | 1793234 A2 | 6/2007 |
| WO | WO-2007016832 A1 | 2/2007 |
| WO | WO-2007061832 A1 | 5/2007 |
| WO | 2017211599 | 12/2017 |

OTHER PUBLICATIONS

Ripka, Pavel, "Electric current sensors: a review", *Meas. Sci. Technol.*, 21, (2010), 1-23.

"Base-PCB Rogowski Coil, Shanghai Pinyan M&C Technology Co. Ltd.", [online]. © 2016 Media Data Systems Pte Ltd. [retrieved on Aug. 9, 2016]. Retrieved from the Internet: <URL: http://www.globalsources.com/si/AS/Shanghai-Pinyan/6008845472268/pdtl/Base-PCB-Rogowski-coil/1052501247.htm>, (2016), 3 pgs.

"PCB based B-Field Probe", EEVblog Electronics Community Forum [online]. [retrieved on Aug. 9, 2016]. Retrieved from the Internet: <URL: EEVblog Electronics Community Forum>, (2016), 3 pgs.

"Pulse Electronics Sidewinder®—Current Sensor", (2016), 6 pgs.

"Taehwatrans Current Transformer Specification, Model No. TMR120L", (2016), 1 pg.

"Taehwatrans Current Transformers Catalog", (2013), 52 pgs.

Artero, J. A., et al., "Influence of External Currents in Sensors Based on PCB Rogowski Coils", [online]. [archived on Feb. 9, 2014]. Retrieved from the Internet: <URL: https://web.archive.org/web/20140209110025/http://icrepq.com/full-paper-icrep/274-artero.pdf>, (2014), 1-4.

Lisowiec, Aleksander, et al., "Air core transducer with increased measurement sensitivity", *Przeglad Elektrotechniczny*, R. 91, Nr. 4, (2015), 33-35.

Votzi, et al., "Low-Cost Current Sensor for Power Capacitors Based on a PCB Rogowski-Coil", Paper 103, *PCIM Europe*, May 17-19, 2011, Nuremberg, Germany, (2011), 621-626.

"International Application Serial No. PCT/EP2017/062778, International Search Report dated Oct. 6, 2017", 7 pgs.

"International Application Serial No. PCT/EP2017/062778, Written Opinion dated Oct. 6, 2017", 10 pgs.

* cited by examiner

CURRENT SENSOR AND A METHOD OF MANUFACTURING A CURRENT SENSOR

TECHNICAL FIELD

The present disclosure relates to current sensors and methods of manufacturing current sensors.

BACKGROUND

A current sensor is an electrical device which detects and measures the electrical current passing through a conductor. Current sensors are required in many applications such as energy meters, electrical generators and circuit protection systems. There are two main types of current sensors. The first type introduces a "shunt" resistance into the circuit. This involves placing a resistor in series with the conductor, and measuring the voltage across the resistor. Shunts work well for currents under a few hundred amps. For higher currents, heating occurs in the shunt which makes them difficult to manage. Furthermore, because the shunt is electrically connected to the conductor, suitable isolation methods are required to interface the shunt with processing electronics. The second type uses a magnetic transducer. Magnetic transducers work by detecting changes in the magnetic fields generated by the current carrying conductor. As such, there is no need for an electric connection with the conductor, and magnetic transducers are therefore naturally isolated from the conductor.

Two types of magnetic transducer are used for current sensing. The first type uses a highly permeable magnetic core. Such devices are susceptible to tampering, because if a permanent magnet is brought into close proximity with the device, its output can be manipulated. This is because the permanent magnet causes the permeable core to saturate, which renders the transducer insensitive to the time-varying currents it should be detecting. The second type of magnetic transducer consists of a conductive helical coil formed as a torpid. Such coils are referred to as Rogowski coils. A benefit of Rogowski coils is that they do not contain a magnetic core, and as such are immune to tampering using permanent magnets. One problem with Rogowski coils is that they are susceptible to interference from nearby current carrying conductors. As such, Rogowski coils include a so-called compensation wire. One end of the wire is passed through the coil to form a loop within the helical coil. The helical wire is for detecting currents in a conductor encircled by the toroid. The loop, or compensation wire, is for cancelling the effect external fields generated by conductors passing close to the axis of the toroid. However, even with a compensation wire, Rogowski coils can be subject to interference.

SUMMARY OF THE DISCLOSURE

With the rapid rise in more sophisticated energy meters that report energy usage to a central network (so called smart meters), there is an increased demand for accurate, interference resistant current sensors. Furthermore, there is a drive towards producing such sensors using printed circuit board (PCB) technology and to utilise mass production surface mount technology (SMT) in order to drive down costs. Several examples of PCB Rogowski coils are available. However, these coils tend to suffer from poor performance, as compromises in the design of the Rogowski coil must be made in order to accommodate the design in a two-dimensional PCB arrangement. For example, resistance to interference is reduced, largely because of an absence of any sort of compensation wire, or the use of sub-optimal compensation wire arrangements. For example, the compensation wire may be provided outside of the coil. Furthermore, the coil may be two-dimensional, as it is provided in a single plane of the PCB.

The present inventors have recognized, among other things, that there is a requirement for an improved Rogowski-type current sensor which may manufactured on a printed circuit board.

The present disclosure provides an improved Rogowski-type current sensor. In order to allow the sensing coil and the compensation wire to overlap, the sensor is produced using two boards. The current sensing coil is provided on one board, and the compensation wire is provided on another board. The coil and the wire are arranged such that they at least partially overlap, and ideally the compensation wire is formed entirely within the area defined by the coil, albeit in a different plane. This arrangement makes the current sensor far better at rejecting interference than prior art PCB arrangements. In addition, the coil may be formed on a two-sided board. The board has upper radial elements formed on an upper surface, and lower radial elements formed on lower surface. The radial elements are connected using vias formed in the board. The upper radial elements are arranged in a first plane, and the lower radial elements are formed in a second parallel plane. The upper radial elements are arranged so that they are aligned with the lower radial elements, such that a pair of radial elements form a radial plane that is perpendicular to the board surface. This symmetry ensures excellent sensitivity to currents in a conductor.

In a first aspect the present disclosure provides a current sensor comprising: a first board supporting a first current sensing coil, the first current sensing coil being forming around an opening in the first board, a first compensation wire formed on a first surface of a second board, the first compensation wire formed around an opening in the second board; wherein the first board is attached to the second board such that their respective openings are aligned, the openings are arranged to receive a current carrying conductor, and the boards are arranged such that the first current sensing coil and the compensation wire at least partially overlap.

In a second aspect the present disclosure provides a current sensing system, comprising at least one sensor according to the first aspect, the at least one sensor comprising an output, and a signal processing circuit, coupled to the output, wherein the signal processing circuit is positioned on the first or second boards.

In a third aspect the present disclosure provides a current sensing system, comprising: at least two sensors according to the first aspect, wherein a board of each sensor is the same board, and each of the at least two sensors is for sensing current in a different current carrying conductor.

In a fourth aspect the present disclosure provides a current sensing coil comprising: a double-sided board; a first set of radial elements formed on a first side of the board; a second set of radial elements formed on a second side of the board; and a plurality of vias, formed in the double-sided board, and arranged to connect ends of the first set of radial elements to respective ends of the second set of radial elements; wherein the each radial element on the first side of the board is aligned with a respective radial element on the second side of the board, such that the respective radial elements form a radial plane which is orthogonal to the surfaces of the board.

In a fifth aspect the present disclosure provides a method of manufacturing a current sensor, comprising: providing a first board having an opening formed therein; forming a first current sensing coil on the first board around the opening in the first board; providing a second board having an opening formed therein; forming a first compensation wire on a first surface of the second board around the opening in the second board; attaching the first board to the second board such that that the respective openings are aligned; wherein the openings are arranged to receive a current carrying conductor, and the boards are arranged such that the first current sensing coil and the first compensation wire at least partially overlap.

Further features of the disclosure are provided in the appended claims, which features can optionally be combined with each other in any permutation or combination, unless expressly indicated otherwise elsewhere in this document.

BRIEF DESCRIPTION OF THE DRAWINGS

The present disclosure will now be described, by way of example, with reference to the accompanying drawings, in which.

DETAILED DESCRIPTION OF EMBODIMENTS OF THE DISCLOSURE

In an embodiment of the disclosure, a current sensor is provided using at least two boards. A toroidal current sensing coil is provided on a coil board. A compensation wire is provided on a motherboard. Both boards include an opening through which a conductor may pass. These openings are aligned. The compensation wire is aligned with the current sensing coil such that the compensation wire at least partially overlaps with the coil. The compensation wire may be formed in a number of different patterns, but typically is provided so that it is substantially formed within the outer edge the coil. The arrangement provides a significant improvement in terms of interference rejection over the prior art PCB arrangements in which the compensation wire is either omitted or provided outside the area defined by the coil.

In addition, the coil board may be a two-sided board, and the coil may be formed on the upper and lower sides of the board. An upper set of radial elements may be formed on the upper side, and a lower set of radial elements may be formed on the lower side. The upper and lower elements may connected using vias formed in the board. At least one end of the coil is connected to the compensation wire. The upper radial elements are aligned with the lower radial elements, forming radial planes that are perpendicular to the surface of the board. This is achieved by using "kinks" at the outer ends of each radial element in order to make an electrical connection with the vias. The kinks are formed within an edge space defined by the vias, and as such the lengths of the radial elements are not compromised. The symmetry that results makes the coil particularly sensitive to currents when compared with the sub-optimal PCB coil arrangements shown in the prior art.

In view of the above, the present disclosure provides a PCB-based current sensing coil that strongly rejects interference and accurately detects currents in the conductor under test.

Figure 1:
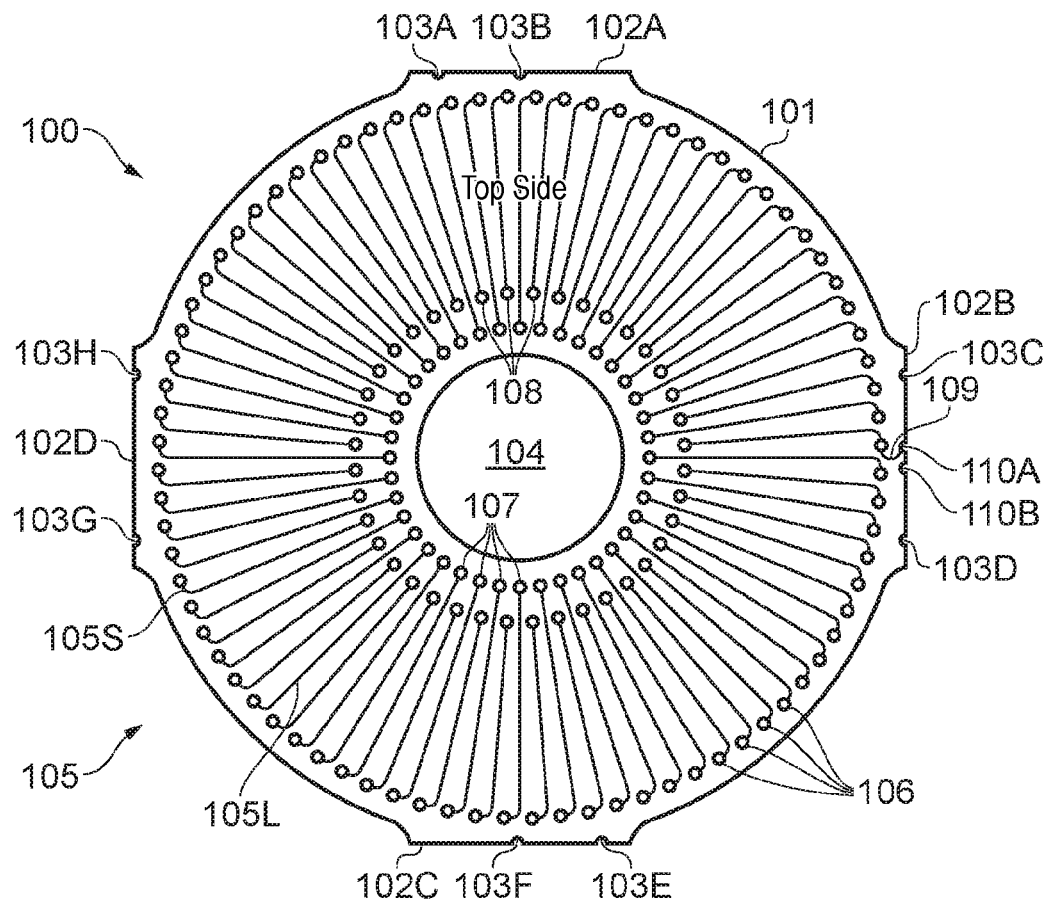
FIG. 1 is a top-view of a current sensing coil in accordance with an embodiment of the disclosure.

FIG. 1 shows a top view of an example of a current sensing coil 100. The coil 100 is formed on coil board 101 which in this embodiment is a printed circuit board (PCB). Coil board 101 is substantially cylindrical in shape. As can be seen from the top-down view shown in FIG. 1, the outer edge of the coil board 101 is substantially circular. However, board-mounting portions 102A, 102B, 102C and 102D are formed around the periphery of the coil board 101 in order to provide a mechanism to secure the coil board to another PCB. The board-mounting portions 102A-D may be positioned at 90 degree intervals around the edge of the coil board 101. Each board-mounting portion includes a straight edge which is tangential to a point on the circumference of the coil board 101 at a position around the mid-point of the straight edge of the board-mounting portion. As such, each board-mounting portion extends away from the circumferential edge of the coil board 101.

Each board-mounting portion includes two castellated vias. Board-mounting portion 102A includes castellated vias 103A and 103B. Board-mounting portion 102B includes castellated vias 103C and 103D. Board-mounting portion 102C includes castellated vias 103E and 103F. Board-mounting portion 103D includes castellated vias 103G and 103H. The castellated vias may be used to solder the coil board 101 to a further PCB. This process will be described in more detail below.

A circular hole 104 is formed at the centre of the coil board 101. The hole 104 is to allow a conductor to pass through the current sensing coil 100. The diameter of the coil board 101 may be 35 mm, and the diameter of the hole 104 may be 9 mm. However, depending on the application, the diameter of the coil board 101 may be in the range of 20 mm to 100 mm, and the diameter of the hole 104 may be in the range of 1 mm to 30 mm. The board 101 also has a thickness which may be 2 mm. The thickness of the board may be in the range of 0.5 mm to 5 mm.

The current sensing coil 100 is formed, in part, by a number of radial elements. As there are a large number of radial elements, they have not been individually identified in FIG. 1, but are collectively referred to by reference 105.

As can be seen in FIG. 1, the current sensing coil 100 includes a large number of closely spaced radial elements 105. The radial elements 105 are either long radial elements 105L or short radial elements 105S. As can be seen in FIG. 1, the long and the short elements are arranged in an alternating arrangement. All of the radial elements 105 are connected to respective outer circumferential vias 106. The outer circumferential vias 106 are formed around the circumference of a circle close to the edge of the coil board 101. In the present example, the outer vias 106 are positioned approximately 1 mm from the edge of the coil board 101. The outer circumferential vi as 106 have a conductive lining and are for coupling the radial elements on the top side of the current sensing coil 100, to corresponding radial elements on the bottom side of the current sensing coil 100. The long radial elements 105L are connected to respective first inner circumferential vias 107. The short radial elements 105S are connected to second inner circumferential vias 108. The first inner circumferential vias 107 are formed approximately 2 mm from the edge of hole 104, and the second inner circumferential vias 108 are formed approximately 4 mm from the edge of hole 104. Both sets of inner circumferential vias have a conductive lining that are arranged to couple the inner ends of the long and short radial elements to corresponding long and short radial elements on the bottom side of the current sensing coil 100.

As can be seen in FIG. 1, the first inner circumferential vias 107 present a physical limitation to the number of vias that can be formed on the circumference of the circle drawn through those vias. If all of the radial elements were of the same length, this inner circle would define the winding density of the device. By shortening every other radial element, it can be seen that an additional set of radial elements may be provided on the coil board 101, effectively doubling the number of radial elements, and doubling the winding density. As such, it is effectively the outer circumferential vias 106 that define the number of radial elements that may be formed on the surface of the coil board 101, and hence the coils winding density.

It should also be noted that the radial elements are straight, and are ideally exactly aligned with the radii of the circle formed by the coil board 101. The radial elements may be within +/−2 degrees of being exactly radial. Preferably, the radial elements may be within +/−1 degree of being exactly radial. Further details of the geometry of the coils will be described below.

The current sensing coil 100 must be provided with external connections. As such, a coil connection track 109 is formed on the board-mounting portion 102B in order to provide an external connection. Two coil connection castellated vias 110A and 110B are also formed towards the middle of board-mounting portion 102B. The coil connection track 109 is coupled to coil connection castellated via 110A. Coil connection castellated via 110B is used to couple the radial elements on the bottom side of the coil board 101 to external connections.

In the above-described embodiment, the sensing coil 100 is circular. An important feature of the sensing coil 100 is that it is symmetrical. A symmetric coil is more sensitive to current flowing in a conductor of interest, and is better at rejecting interference. As an alternative to a circular design, the coil may be square or rectangular. As with the circular design, it is important that the coil be symmetrical, whatever its shape.

Figure 2:
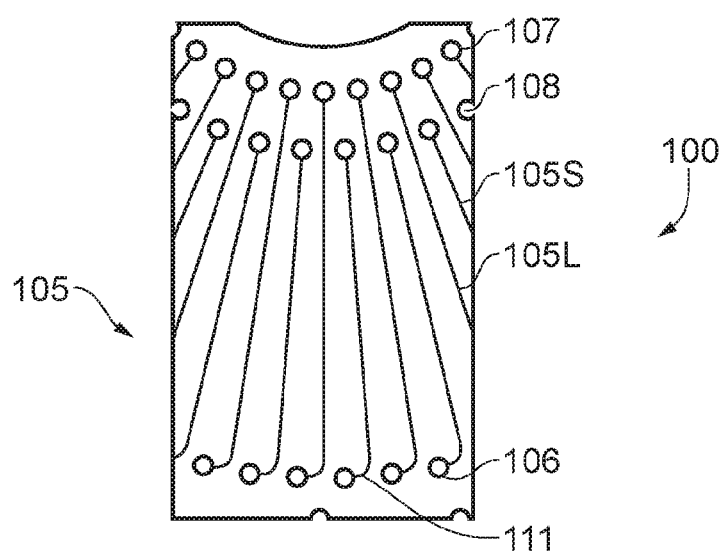
FIG. 2 is a close-up of the coil of FIG. 1.

FIG. 2 is a close-up of an example of the current sensing coil 100 showing a small number of radial elements 105. This Figure highlights and clarifies the manner in which the radial elements 105 are coupled to their respective vias. All of the radial elements 105 are connected to their respective inner circumferential vias such that the centre point of each via is in line with the radial element. This can clearly be seen in FIG. 2. The outer ends of the radial elements 105 are not connected to the outer circumferential vias 106 in the same manner. Instead, each outer circumferential via 106 is positioned at a midpoint between two radial elements 105. Each radial element 105 extends to a point almost on the same circumference as a circle drawn through the midpoint of the outer circumferential vias 106. Each radial element 105 is then coupled to its respective outer circumferential via 106 by a short circumferential conductive portion 111. A circumferential conductive portion 111 may be referred to as a "kink". In one embodiment, the kinks may be parallel to, or even formed on, a circle drawn through the centre points of the vias 106. Alternatively, the conductive portions 111 may be formed at an angle of up to 45 degrees away from the circumference of the circle formed through the vias 106.

The benefit of this feature, as will be seen below, is that the radial elements 105 on the top surface of the coil board 101 may be exactly aligned with corresponding radial elements on the bottom side of the coil board 101.

Figure 3:
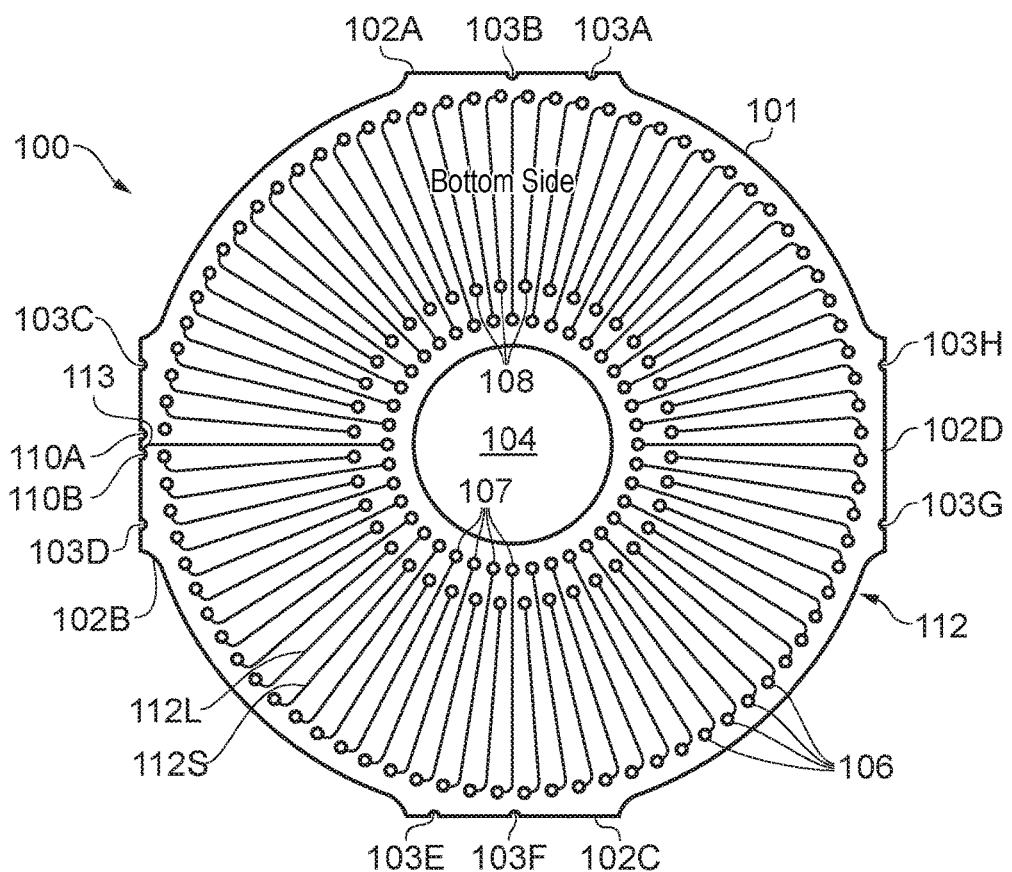
FIG. 3 is a bottom-view of the coil of FIG. 1.

FIG. 3 shows the bottom side of an example of the current sensing coil 100. As can be seen, other than one of two minor differences, the arrangement of the current sensing coil 100 is identical to that of the top side. In particular, the coil board 101 includes the same board-mounting portions 102A, 102B, 102C and 102D. However, they are of course reversed when compared to viewing from the top side. The bottom side of the coil board 101 includes lower radial elements 112, which include long radial elements 112L and short radial elements 112S. The lower radial elements 112 are connected to the vias 106, 107 and 108. In order to connect the lower radial elements to an external circuit, a coil connection track 113 is provided on board-mounting portion 102B, and is connected to the coil connection castellated via 110B.

As such, the structure formed by the upper radial elements 105 and the lower radial elements 112, as well as the vias 106, 107 and 108, is a coil that progresses in a circumferential direction around the coil board 101 from coil connection castellated via 110A to coil connection castellated via 110B. This structure may be regarded as a modified-Rogowski coil.

Figure 4:
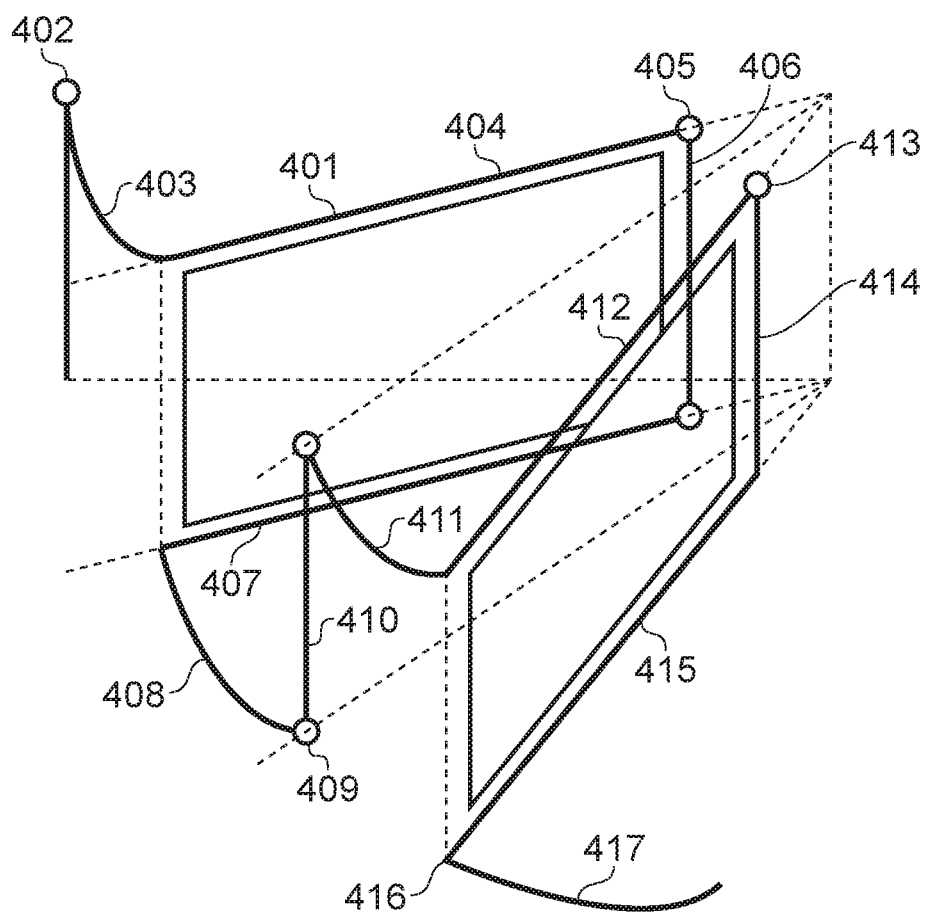
FIG. 4 shows the geometric arrangement of the current sensing coil of FIG. 1.

FIG. 4 is provided to give a better understanding of the geometric relationship of the radial elements 105 and 112. This Figure is not drawn to scale. In FIG. 4, the continuous line 401 represents the conductive path formed by a combination of the upper radial elements 105, lower radial elements 112 and the vias 106, 107 and 108. In this example, the path begins at node 402, which represents an outer circumferential via 106. The path 401 traces along section 403, which corresponds to a circumferential conductive portion 111. The path 401 then proceeds along section 404, which corresponds to an upper radial element 105. Section 404 extends to node 405, which represents an inner circumferential via 107. Section 406 represents the conductive lining of inner circumferential via 107. From here, section 407 represents a lower radial element 112. Section 407 proceeds to section 408, which represents a further circumferential conductive portion 111. From here, the pattern repeats through nodes 409, 413 and 416, and section 410, 411, 412, 414, 415 and 417.

As can be seen, sections 404 and 407 create a plane which is formed exactly on a radius of the circle formed by the coil board 101 and which is orthogonal to the plane formed by a surface of the coil board 101. The plane is not twisted and is completely flat. The benefit of this arrangement is that the coil sensitivity to currents flowing in a conductor passing through hole 104 is significantly increased when compared with similar coil arrangements in which the planes formed by the radial elements are twisted or not precisely formed on the radii of the circle formed by coil board 101. This is because the magnetic field generated by the current passing through the coil is perpendicular to the plane of the windings. This also makes the coil as efficient as possible and maximises its rejection of external magnetic fields.

Figure 5:
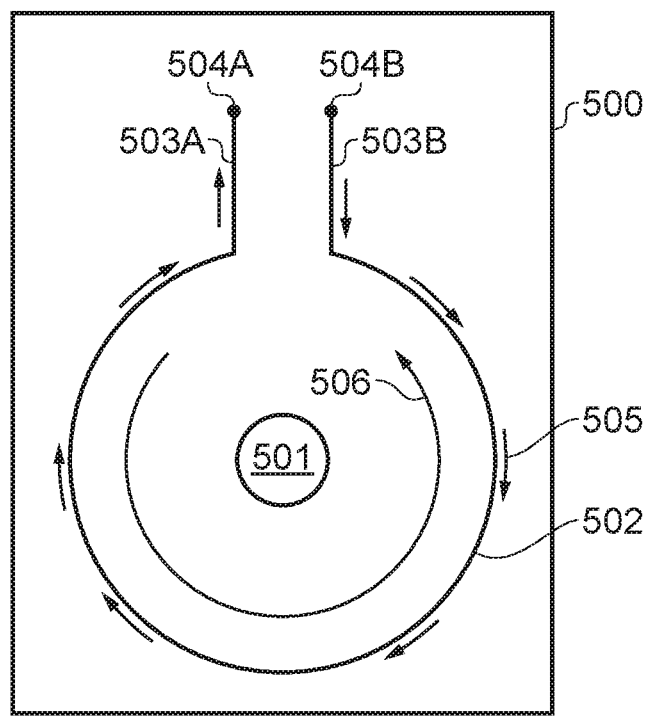
FIG. 5 is a top-view of a compensation board in accordance with an embodiment of the disclosure.

FIG. 5 shows a top view of an example of a compensation board 500. The compensation board 500 may be a PCB having a thickness of around 2 mm. The board 500 is large enough to accommodate the coil board 101 (not shown) on its upper surface, and in this embodiment measures approximately 39 mm in width and 64 mm in length. A hole 501 is formed in the middle of the board, and has the same diameter as the hole 104 in coil board 101. In this example, the hole 501 is approximately 9 mm in diameter. A compensation wire 502 is formed by a conductive track on the top surface of board 500. The compensation wire is formed as a circle centered on the hole 501 and has a diameter that is slightly less than the diameter of the circle formed by the outer circumferential vias 106 shown in FIG. 1. The precise diameter of the compensation wire 502 may be determined empirically for a given current sensing coil 100, in order to position parallel to the board 500. The precise diameter of the compensation wire 502 will be discussed in more detail below.

At either end of the compensation wire 502, a connection track 503A and 503B is formed on the board 500 to connect the compensation wire to solder pads 504A and 504B. These connection points are arranged to be coupled to respective ends of the current sensing coil 100. The arrows 505, pointing in a clockwise direction show the connection sense of the compensation wire 502. The arrow 506, pointing in an anticlockwise direction, shows the pitch advancement of the current sensing coil 100.

Figure 6:
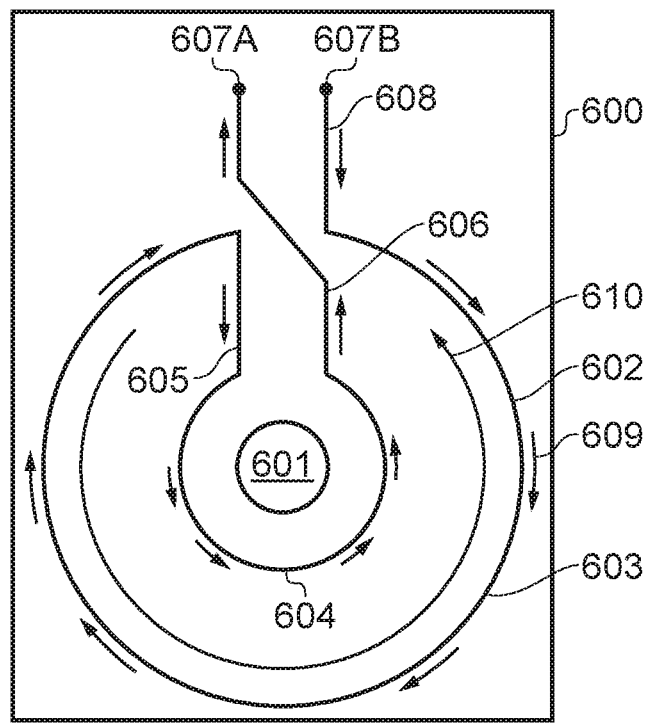
FIG. 6 is a top-view of a compensation board in accordance with another embodiment of the disclosure.

FIG. 6 shows an embodiment in which the compensation wire comprises an inner and an outer loop. In FIG. 6, compensation board 600 includes a hole 601 in the same manner of the compensation board shown in FIG. 5. In this example, a compensation wire 602 includes an outer loop 603 and an inner loop 604. The compensation wire 602 is arranged such that the inner loop 604 and the outer loop 603 are connected in crossover, such that the connection sense is reversed. As such, outer loop 603 is connected at one end by connection track 605 to inner loop 604. Inner loop 604 is connected by conductive track 606 to solder pad 607A. Solder pad 607B is connected to the outer loop 603 by connection track 608. In this example, the circle formed by the outer loop 603 may be aligned with the circle formed by the outer circumferential vias 106. The inner loop 604 may form a circle which is aligned by the circle formed by the first inner circumferential vias 107. The arrows 609, pointing in a clockwise direction show the connection sense of the compensation wire 602. The arrow 610, pointing in an anticlockwise direction, shows the pitch advancement of the current sensing coil 100.

Figure 7:
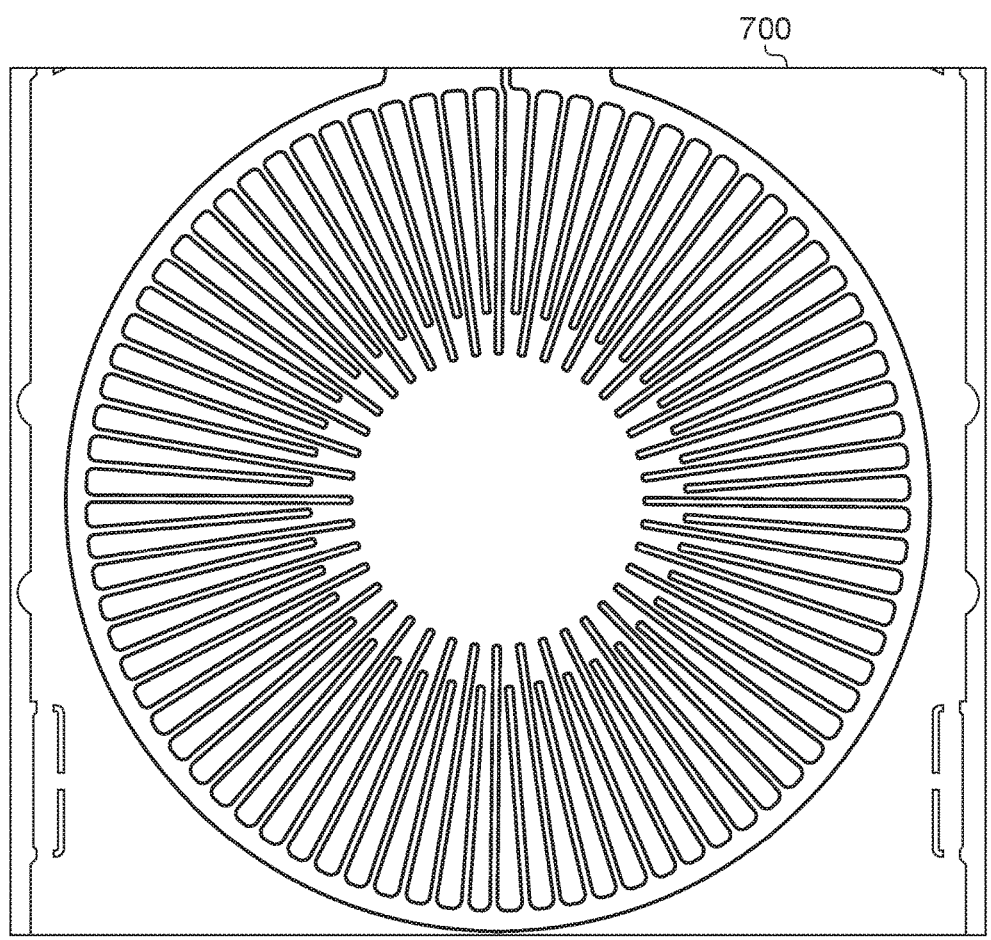
FIG. 7 is a top-view of a compensation wire in accordance with an embodiment of the disclosure.
Figure 8:
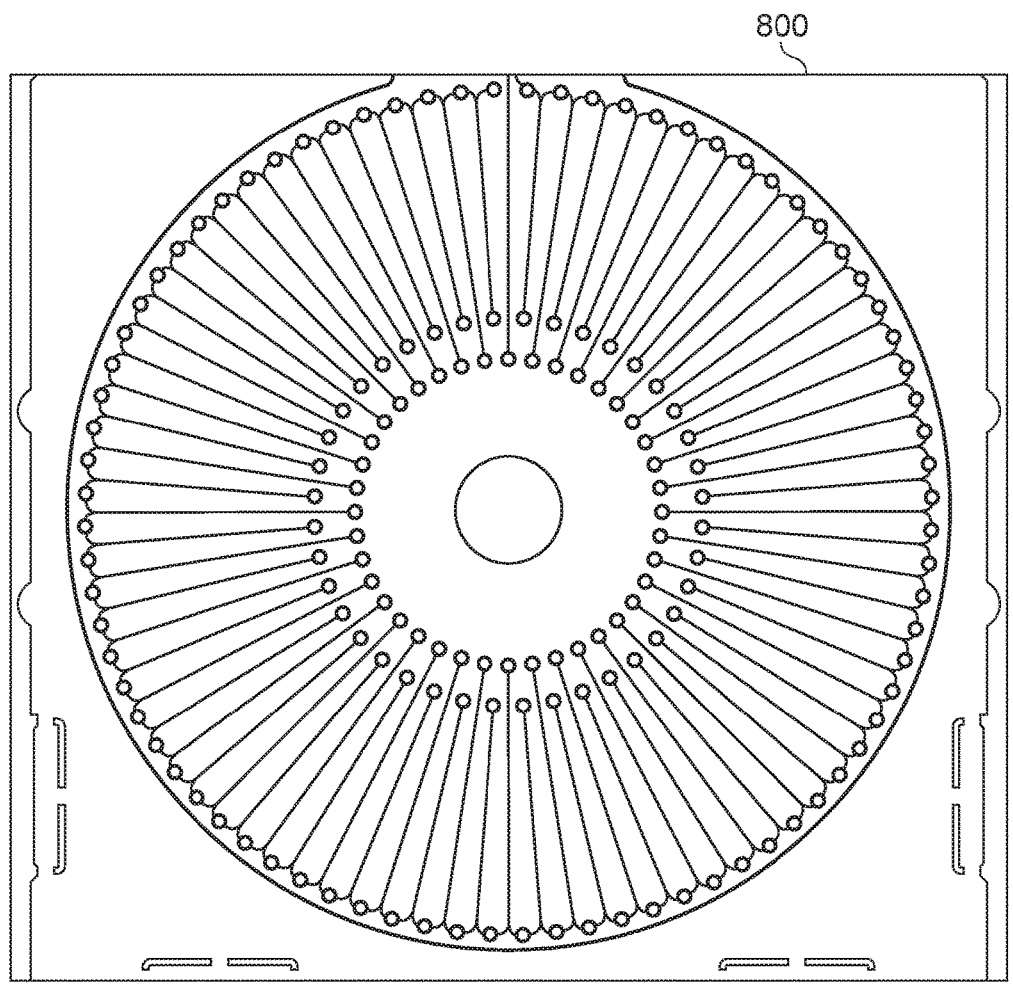
FIG. 8 is a top-view of a compensation wire in accordance with another embodiment of the disclosure.

FIGS. 7 and 8 show further examples for the compensation wire. In FIG. 7, the compensation wire 700 is formed in a zig-zag arrangement. In particular, the compensation wire is formed from a number of radial elements. These radial elements trace under the respective radial elements of the current sensing coil 100. As such, the outer ends of the radial elements of the compensation wire 700 are aligned with the circumference of the circle formed by the outer circumferential vias 106. The inner ends of the radial elements of the compensation wire 700 are aligned in an alternating fashion with the circles formed by the first and second inner circumferential vias 107 and 108.

In the example shown in FIG. 8, the circumferential wire 800 essentially forms a loop that is aligned with the circumference of the circle formed by the outer circumferential vias 106. A number of stubs are then formed radially such that they are aligned with the long and short radial elements 1051, and 1055.

Figure 9:
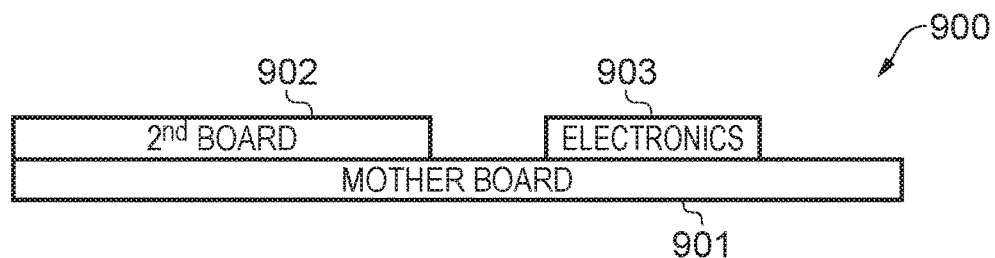
FIG. 9 is a side-view of a current sensor in accordance with an embodiment of the disclosure.

FIG. 9 shows a current sensor 900 in accordance with an embodiment of this disclosure. The sensor 900 includes a motherboard 901, a coil board 902, and electronics 903. The motherboard 901 may, for example, be the compensation board 500 described above in connection with FIG. 5. The coil board 902 may be coil board 101 described above in connection with FIGS. 1 to 4. The current sensing coil and compensation wire formed on the respective coil board 902 and motherboard 901 may be connected to electronics 903. Electronics 903 may include any necessary filtering and amplification components.

Figure 10:
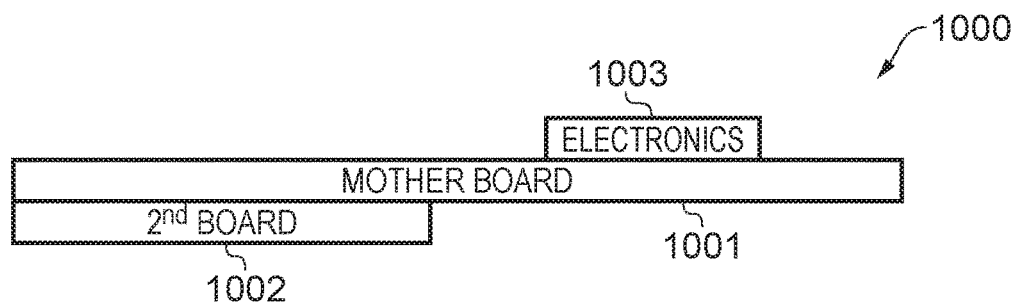
FIG. 10 is a side-view of a current sensor in accordance with another embodiment of the disclosure.

FIG. 10 is an embodiment showing a current sensor 1000. In this example, the coil board 1002 is formed on the underside of the motherboard 1001. In the same manner as described in connection with FIG. 9, the current sensing coil and compensation wire may be connected to electronics 1003.

Figure 11:
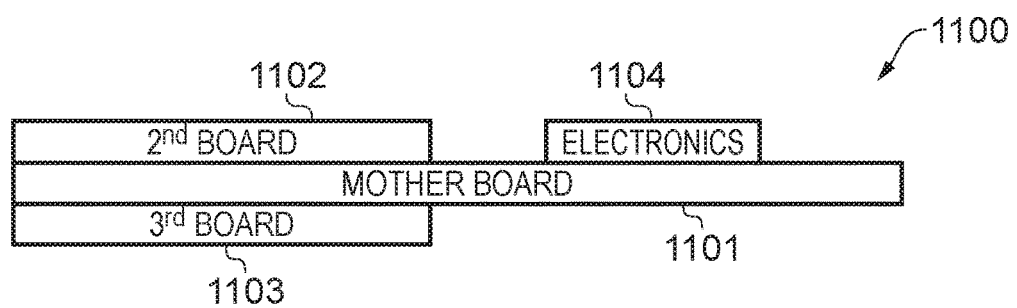
FIG. 11 is a side-view of a current sensor in accordance with another embodiment of the disclosure.

FIG. 11 shows a current sensor 1100 in which two current sensing coils are provided. The sensor 1100 includes a motherboard 1101, first coil board 1102, second coil board 1103, and electronics 1104. In this example, a compensation wire (not shown) is formed on both sides of the motherboard 1101. In this regard, a motherboard 1101 may take the same form as compensation board 500, except that the compensation wire 502 is formed on both sides of the board. The advantage of this arrangement is that two symmetrically opposed single-ended outputs are provided by the two current sensing coils, and as such a pseudo-differential output may be produced. This significantly improves the circuit's ability to reject common mode noise and also doubles the size of the output for approximately a 50% increase in cost.

Figure 12:
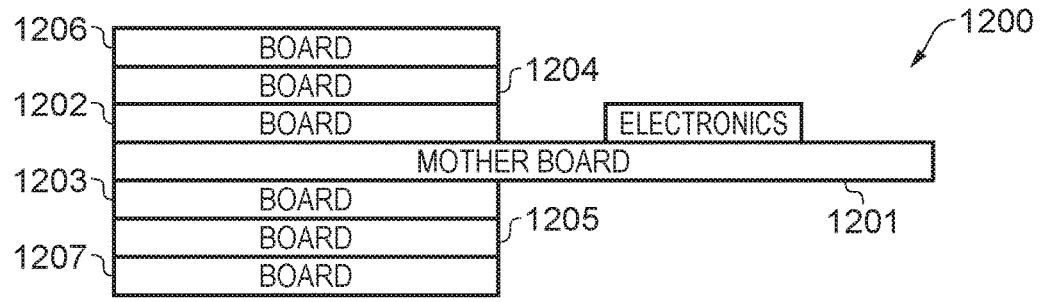
FIG. 12 is a side-view of a current sensor in accordance with another embodiment of the disclosure.

In an embodiment, multiple boards may be stacked either side of a motherboard. FIG. 12 shows a current sensor 1200 including motherboard 1201, first coil board 1202, second coil board 1203, first additional compensation board 1204, second additional compensation board 1205, third coil board 1206, fourth coil board 1207 and electronics 1208. This arrangement improves the sensitivity of the device even further. In an alternative arrangement, the additional compensation boards 1204 and 1205 may be omitted.

Figure 13:
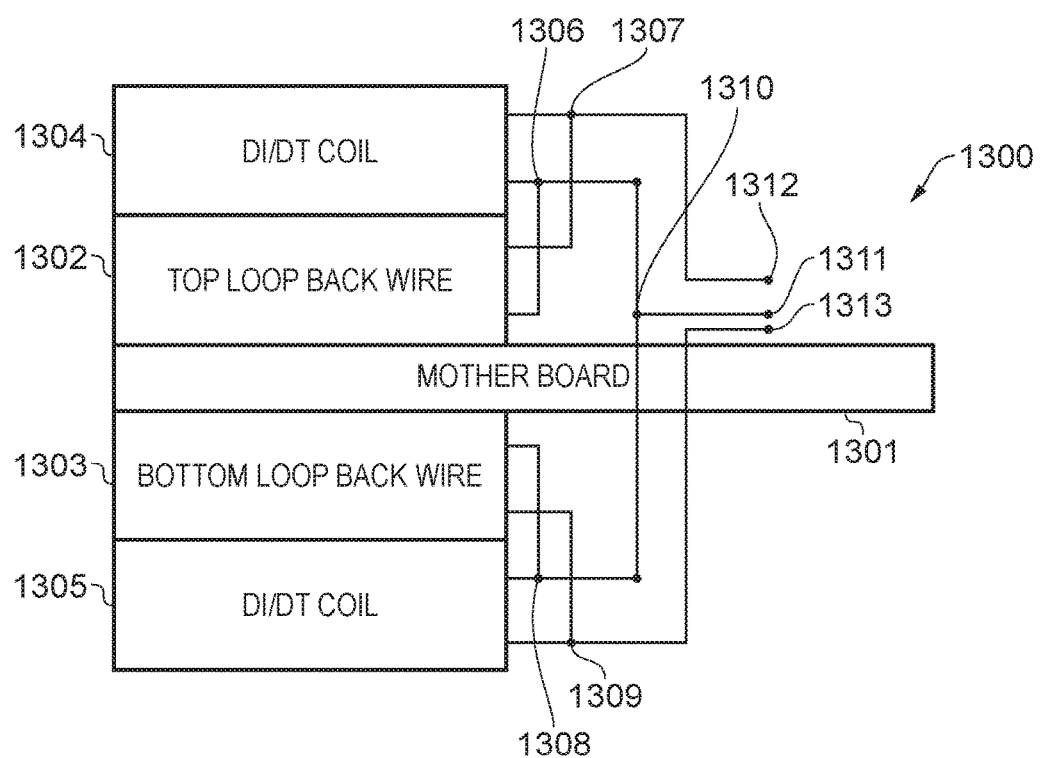
FIG. 13 is a schematic diagram showing the circuit connections of the sensor of FIG. 11.

FIG. 13 shows a current sensor 1300 and includes a schematic circuit diagram showing how a pseudo-differential output may be produced. The current sensor 1300 includes a motherboard 1301, a top compensation wire 1302, a bottom compensation wire 1303, an upper current sensing coil 1304 and a lower current sensing coil 1305. As can be seen, a first output from each of the upper coil and compensation wire is coupled to node 1306 and a second output from each of the upper coil 1304 and compensation wire 1302 is coupled to node 1307. In a similar manner, a first output from each of the lower coil 1304 and lower compensation wire 1303 is coupled to node 1308. A second output from the lower coil 1305 and a lower compensation wire 1303 is coupled to node 1309. Nodes 1306 and 1308 are coupled to node 1310 to provide a common output 1311. Node 1307 is coupled to output 1312 and node 1309 is coupled to output 1313. As such, nodes 1311, 1312 and 1313 provide a pseudo-differential output.

A current sensor formed in accordance with any of the preceding embodiments may be connected to additional electronics to provide amplification and filtering functions. The following examples show various ways in which a sensor may be connected to additional integrated circuits or passive components.

Figure 14:
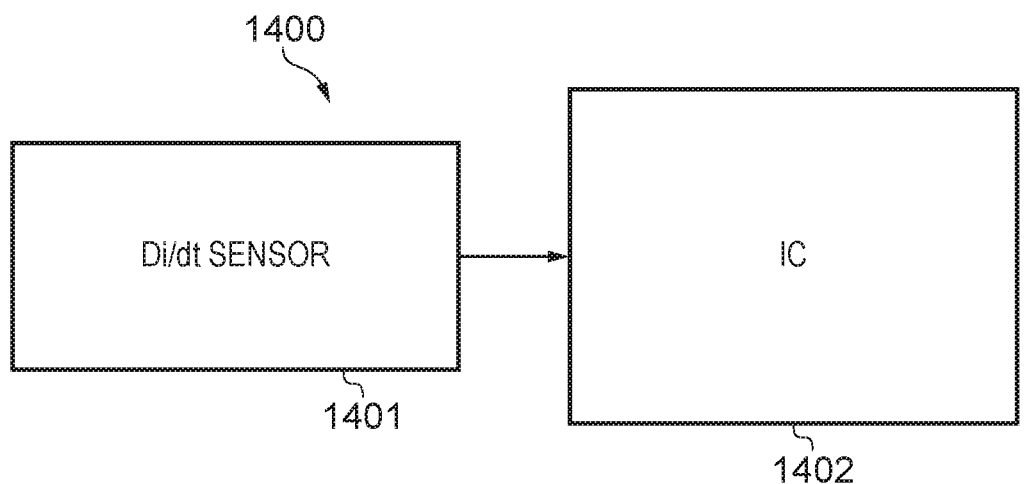
FIG. 14 is a system diagram of a current sensing system in accordance with an embodiment of the present disclosure.

FIG. 14 shows an example of a current sensing system 1400 in which a current sensor 1401 may be coupled to an integrated circuit (IC) 1402. The integrated circuit may be an operational amplifier, a standalone analog-to-digital converter (ADC), a combination of an operational amplifier and an ADC, or a combination of multiple operational amplifiers and multiple ADCs.

Figure 15:
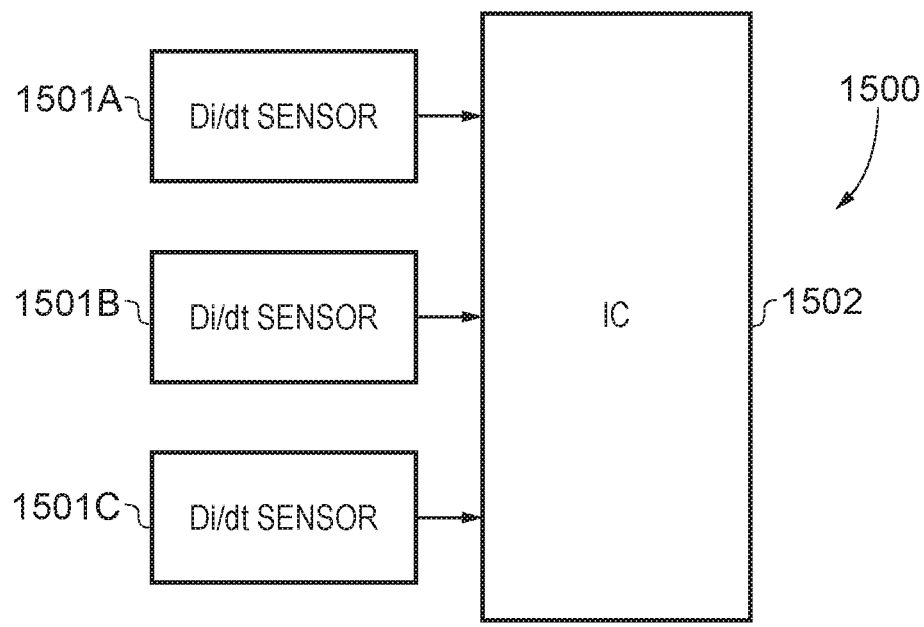
FIG. 15 is a system diagram of a current sensing system in accordance with another embodiment of the present disclosure.

FIG. 15 shows an example of a current sensing system 1500 comprising multiple current sensors 1501A, 1501B, 1501C, each connected to the same IC 1502.

Figure 16:
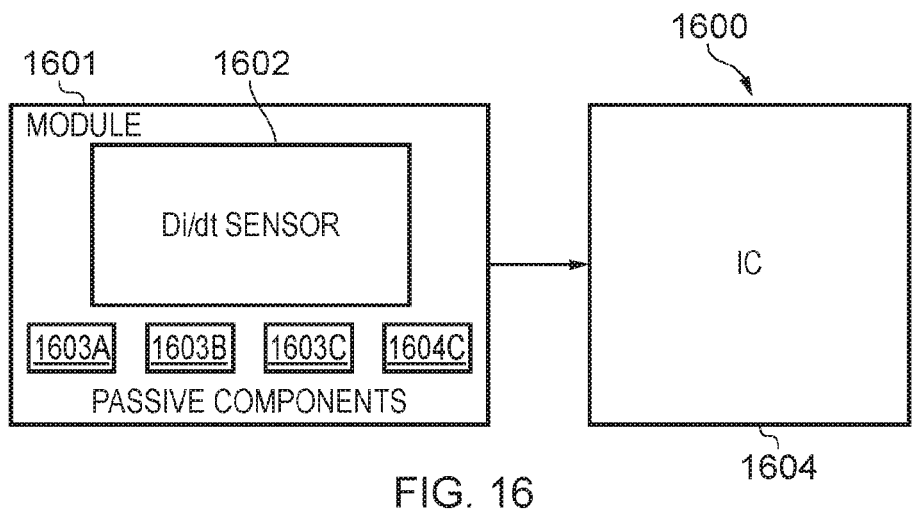
FIG. 16 is a system diagram of a current sensing system in accordance with another embodiment of the present disclosure.

FIG. 16 shows a current sensing system 1600 including a current sensing module 1601. The current sensing module includes a current sensor 1602 as well as a number of passive components 1603A, 1603B, 1603C and 1603D. The current sensing module 1601 may be coupled to an IC 1604.

Figure 17:
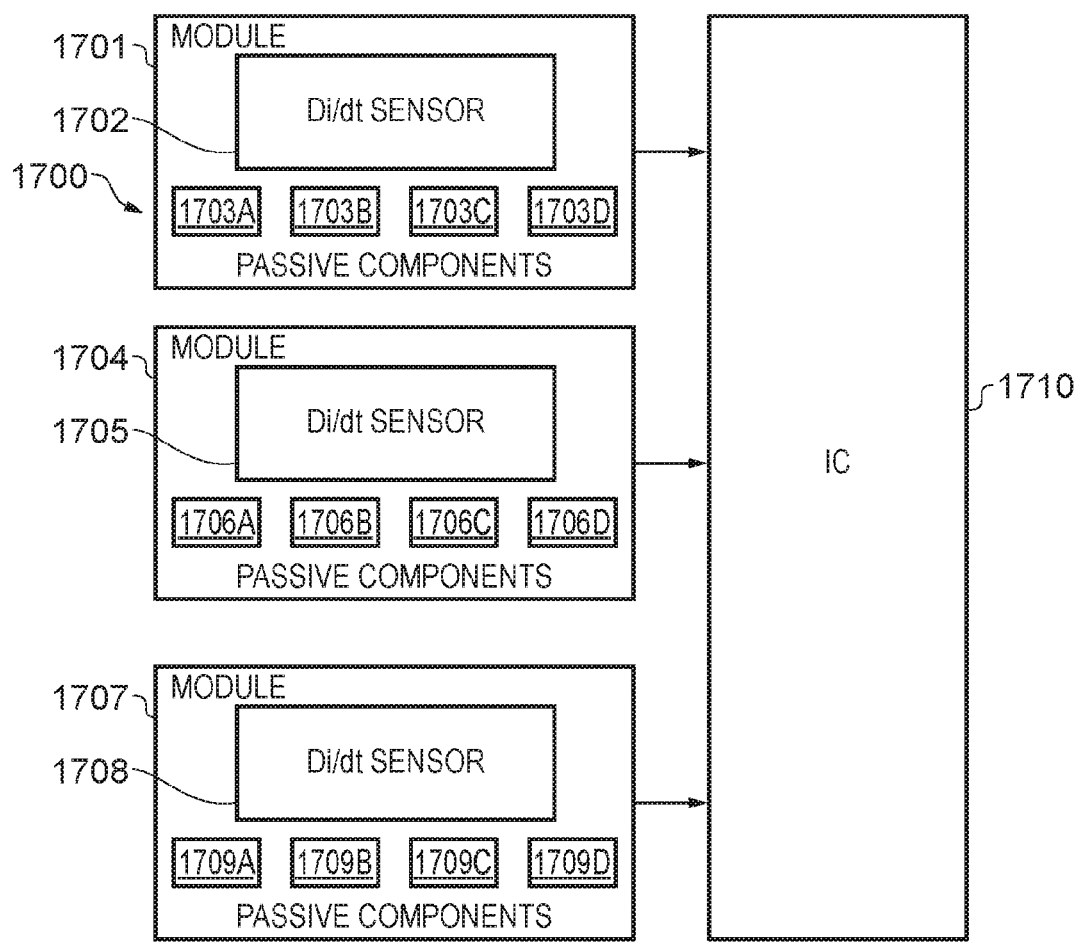
FIG. 17 is a system diagram of a current sensing system in accordance with another embodiment of the present disclosure.

FIG. 17 shows an example of a current sensing system 1700. Current sensing system 1700 includes multiple modules 1701, 1704 and 1707. Module 1701 includes a current sensor 1702 and passive components 1703A, 1703B, 1703C and 1703D. Current module 1704 includes sensor 1705 and passive components 1706A, 1706B, 1706C and 1706D. Current sensing module 1707 includes current sensor 1708 and passive components 1709A, 1709B, 1709C and 1709D. Each module is connected to a single IC 1710.

Figure 18:
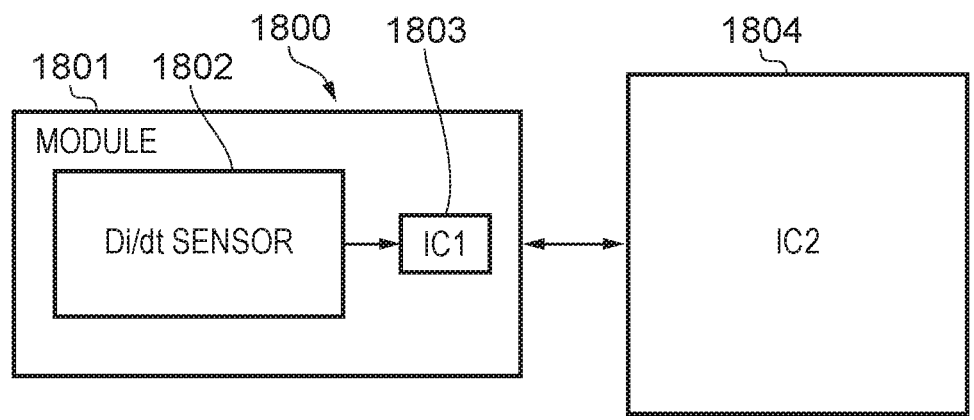
FIG. 18 is a system diagram of a current sensing system in accordance with another embodiment of the present disclosure.
Figure 19:
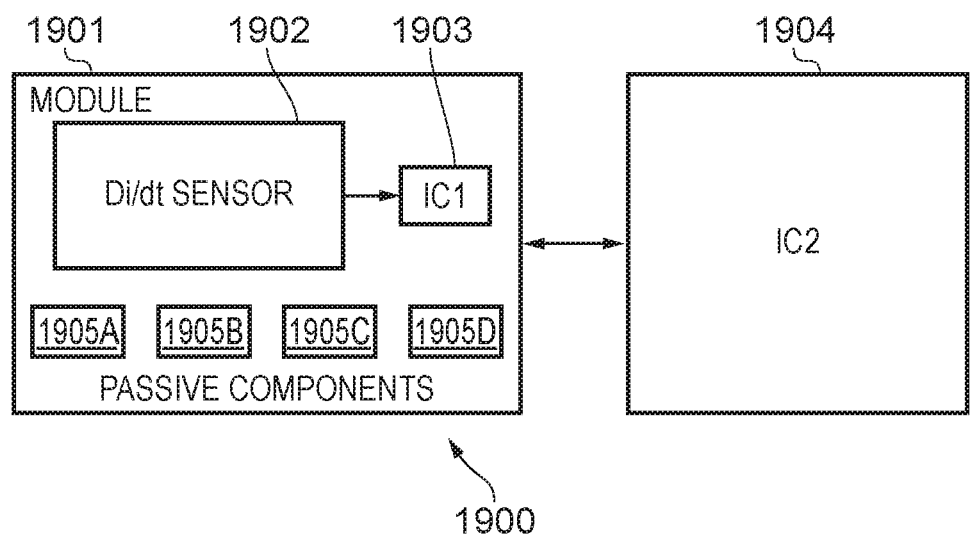
FIG. 19 is a system diagram of a current sensing system in accordance with another embodiment of the present disclosure.

FIG. 18 shows an example of a current sensing system 1800 which includes current sensing module 1801. Current sensing module 1801 includes a current sensor 1802 and an IC 1803. The current sensing module 1801 is coupled to integrated circuit 1804. FIG. 19 shows current sensing system 1900 which includes current sensing module 1901. Current sensing module 1901 includes a current sensor 1902 and an IC 1903. The current sensing module 1901 is coupled to integrated circuit 1904. The current sensing module 1901 also includes passive components 1905A, 1905B, 1905C and 1905D.

Figure 20:
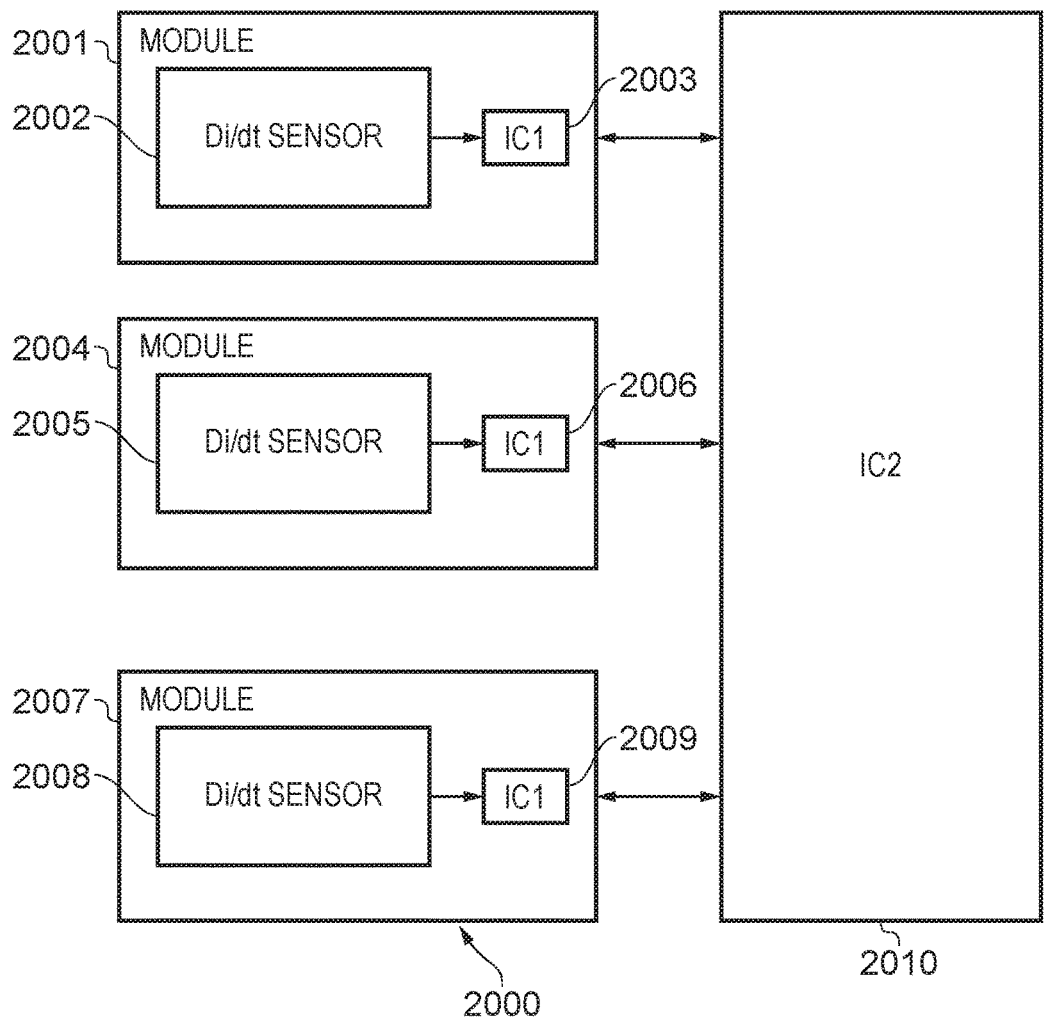
FIG. 20 is a system diagram of a current sensing system in accordance with an alternative embodiment of the present disclosure.

FIG. 20 shows an example of a current sensing system 2000. Current sensing system 2000 includes multiple modules 2001, 2004 and 2007. Module 2001 includes a current sensor 2002 and IC 2003. Current module 2004 includes sensor 2005 and IC 2006. Current sensing module 2007 includes current sensor 2008 and IC 2009. Each module is connected to a single IC 2010.

Figure 21:
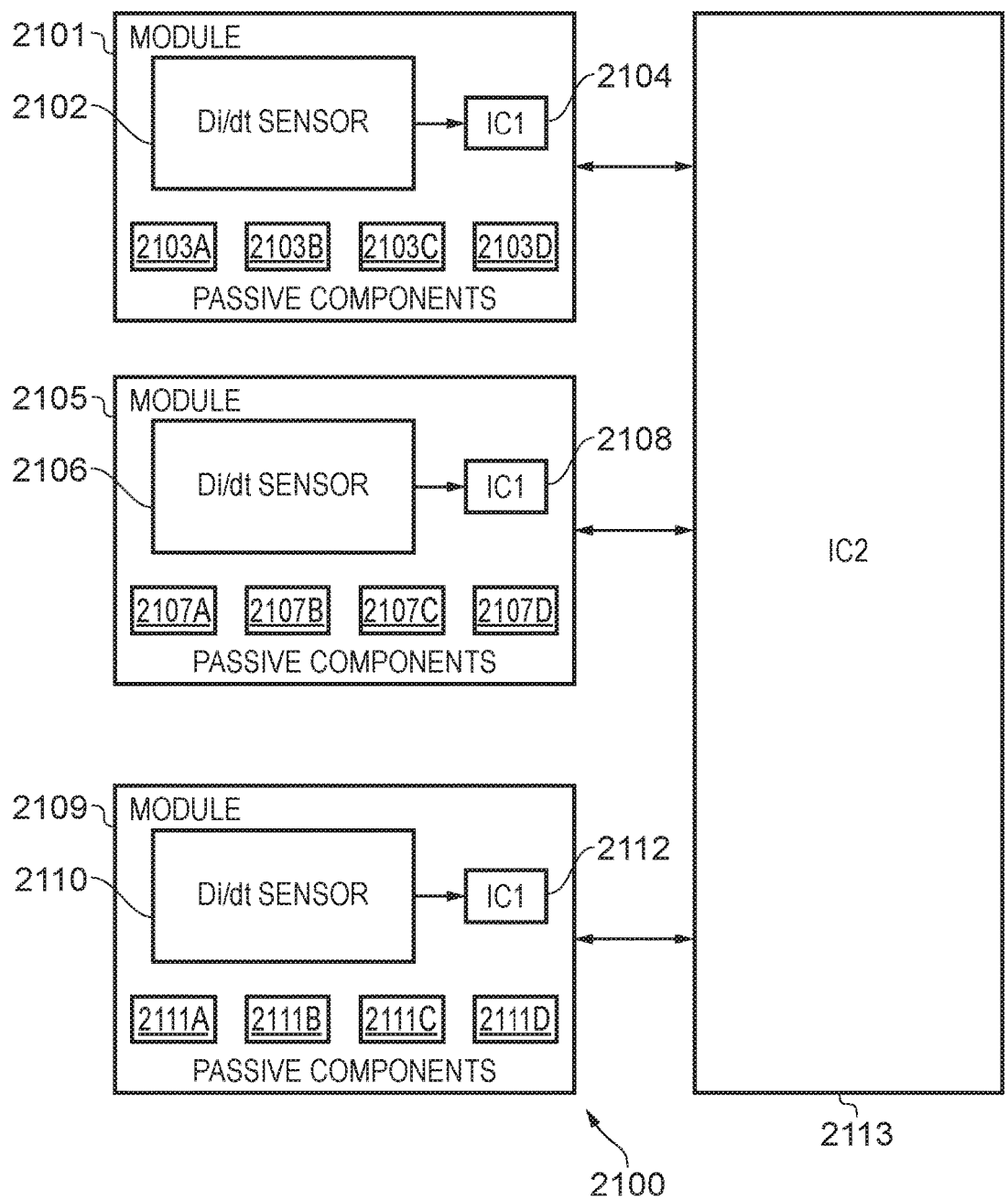
FIG. 21 is a system diagram of a current sensing system in accordance with another embodiment of the present disclosure.

FIG. 21 shows an example of a current sensing system 2100. Current sensing system 2100 includes multiple modules 2101, 2105 and 2109. Module 2101 includes a current sensor 2102, passive components 2103A, 2103B, 2103C and 2103D and IC 2104. Current module 2105 includes sensor 2106, passive components 2107A, 2107B, 2107C and 2107D and IC 2108. Current sensing module 2109 includes current sensor 2110, passive components 2111A, 2111B, 2111C and 2111D and IC 2112. Each module is connected to a single IC 2113.

Figure 22:
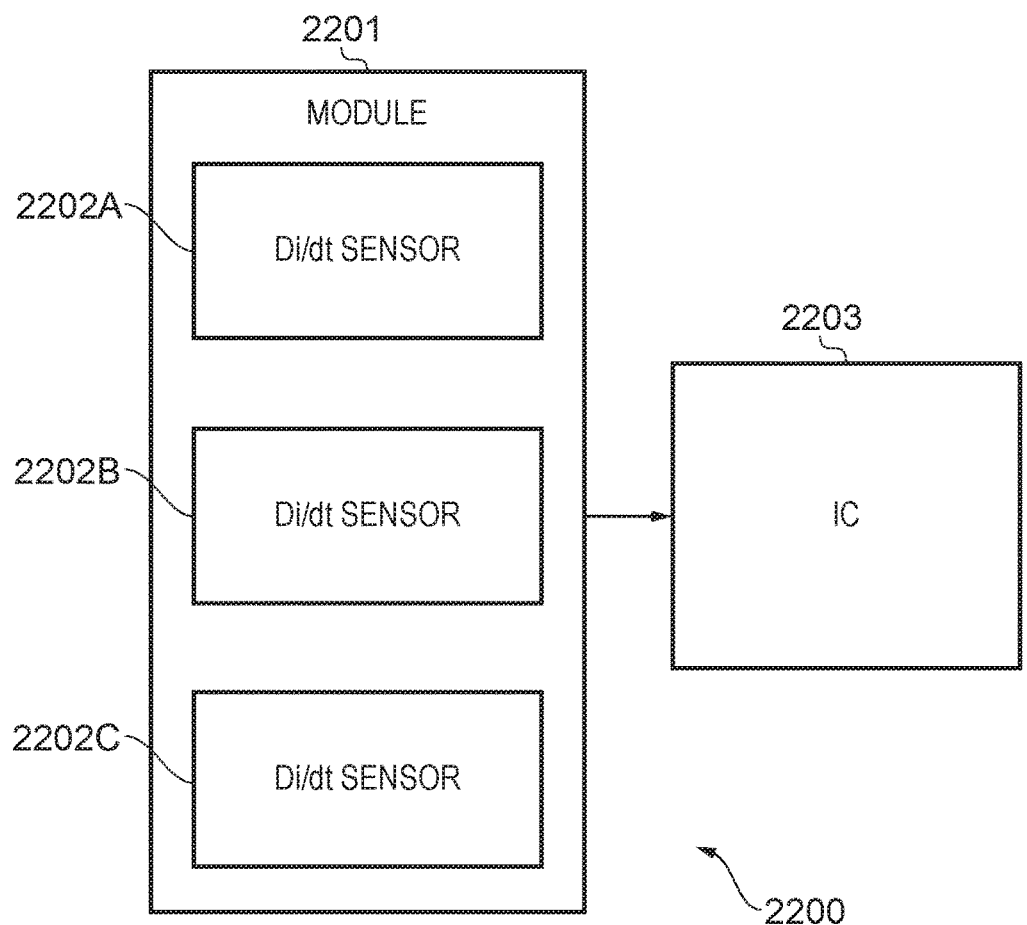
FIG. 22 is a system diagram of a current sensing system in accordance with another embodiment of the present disclosure.

FIG. 22 shows an example of a current sensing system 2200. Current sensing system 2200 includes a module 2101 having formed thereon sensors 2202A, 2202B and 2202C. Module 2201 is coupled to IC 2203.

Figure 23:
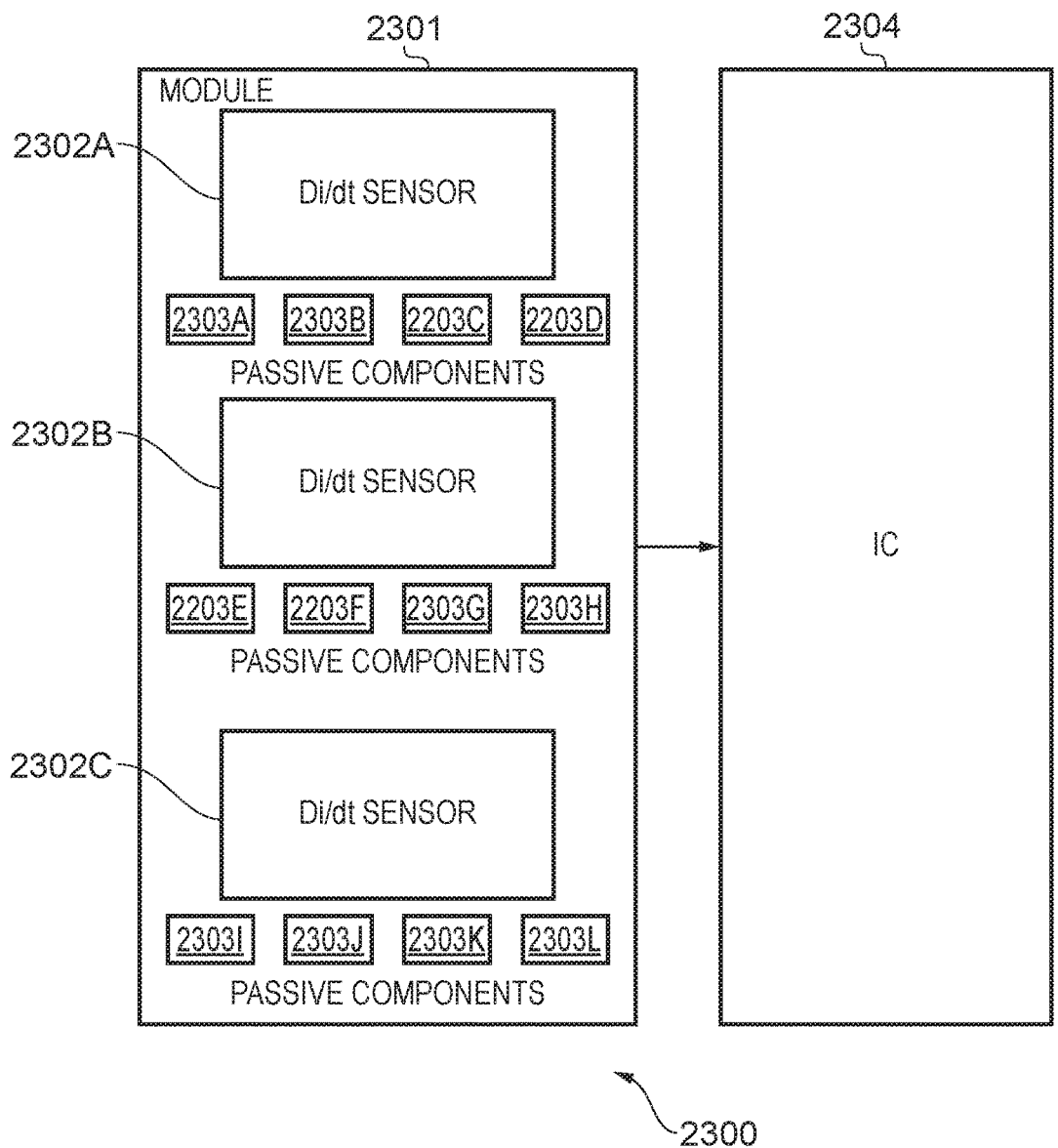
FIG. 23 is a system diagram of a current sensing system in accordance with another embodiment of the present disclosure.

FIG. 23 shows an example of a current sensing system 2300. The current sensing system 2300 includes a module 2301 having sensors 2302A, 2302B and 2302C formed thereon. The module also includes passive components 2303A to L. The module is connected to integrated circuit 2304.

Figure 24:
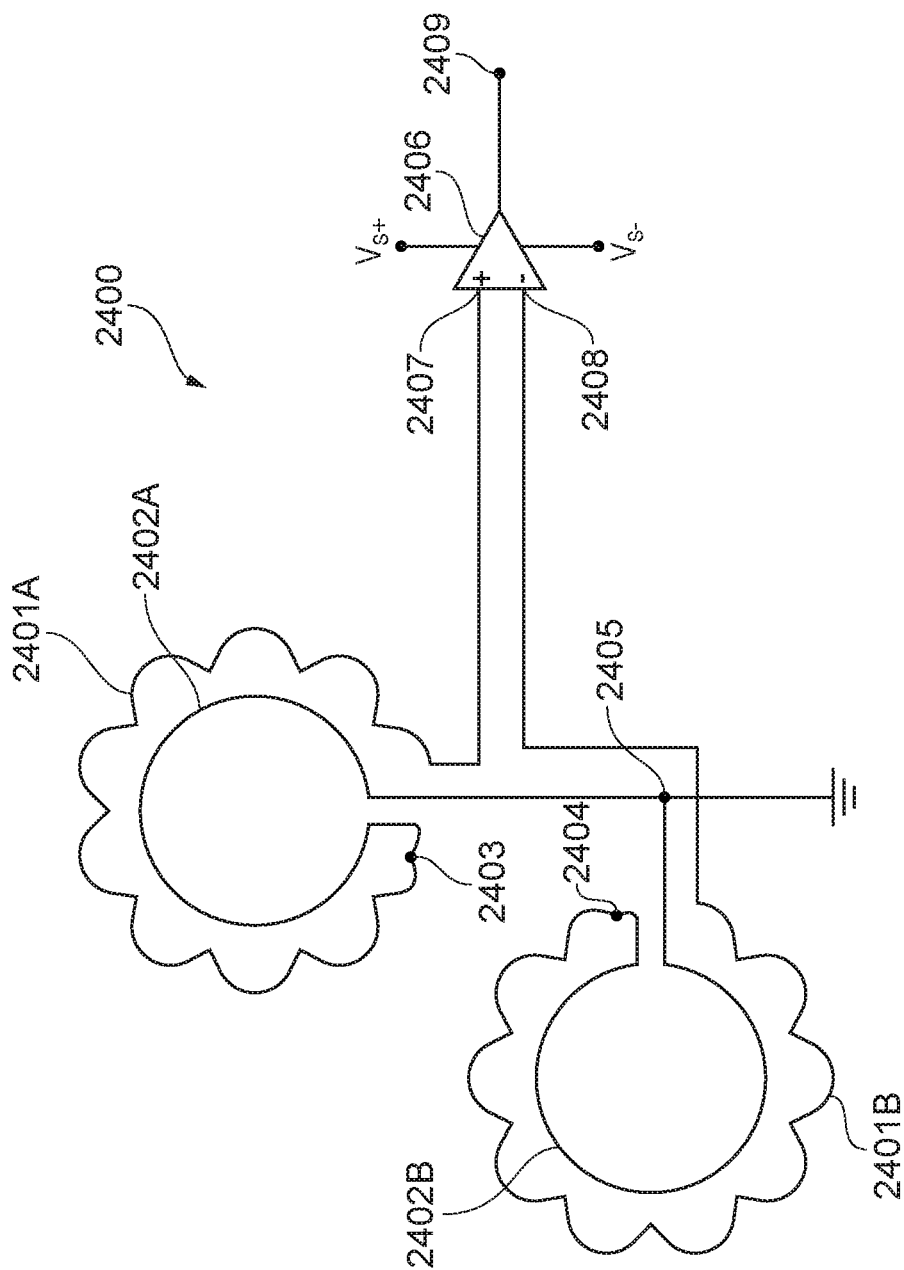
FIG. 24 is a schematic diagram of a current sensor in accordance with an embodiment of the disclosure.

FIG. 24 is a schematic diagram of a current sensor 2400 in accordance with an embodiment of the disclosure. FIG. 24 shows how the current sensing coils and the compensation wires may be connected together and to an amplifier. The sensor 2400 includes two current sensing coils 2401A, 2401B. Each coil may take the same form as coil 100 shown in FIG. 1, The sensor 2400 also includes two compensation wires 2402A, 2402B. Each wire may take the same form as the wires 502, 700 or 800 described above. As such, each wire 2402A, 2402B may be formed on opposite sides of a circuit board. A first end of coil 2401A is coupled to a first end of compensation wire 2402A, at connection 2403. A first end of coil 2401B is coupled to a first end of compensation wire 2402B at connection 2404. The second ends of the compensation wires 2402A, 2402B are coupled together at connection 2405. Connection 2405 is also coupled to ground. The current sensor 2400 also includes a differential amplifier 2406. A second end of coil 2401A is coupled to the non-inverting input 2407 of amplifier 2406. A second end of coil. 2401B is coupled to the inverting input 2408 of the amplifier 2406. The amplifier 2406 generates an output at 2409. The differential amplifier 2406 amplifies any differential signals produced by the current sensing coils. The amplifier is effective at rejecting common mode noise.

Figure 25:
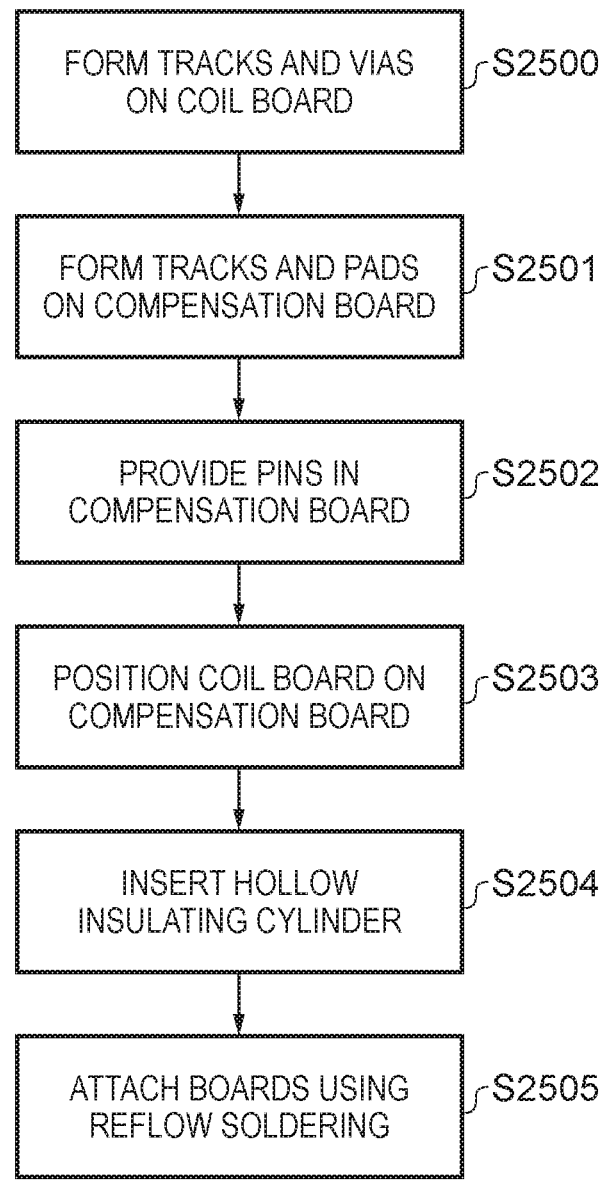
FIG. 25 is a flow-chart showing a method of manufacturing a current sensor in accordance with an embodiment of the disclosure.
Figure 26:
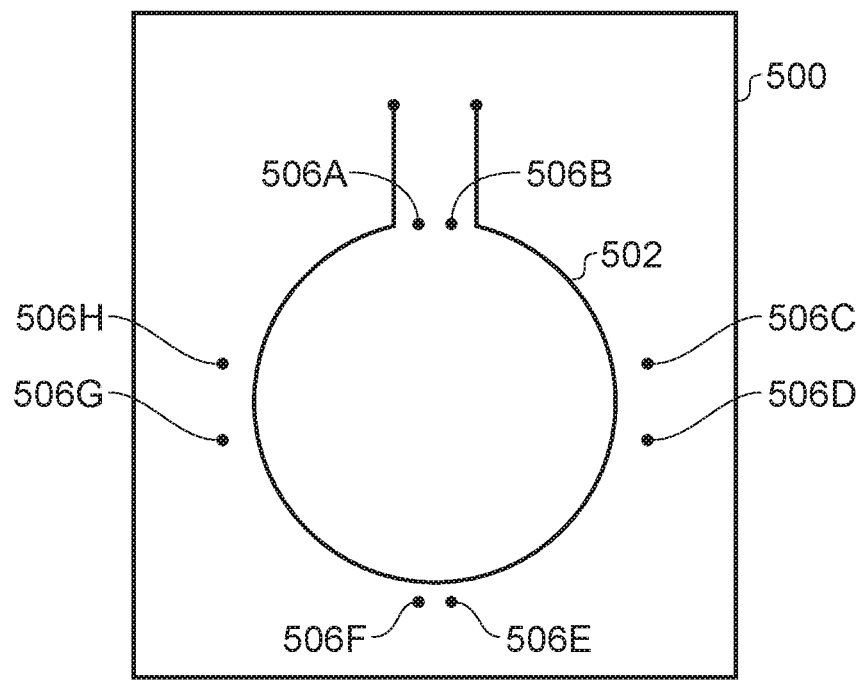
FIG. 26 is shows a top-view of a current sensor after provision of pins in a board of the sensor during manufacture.
Figure 27:
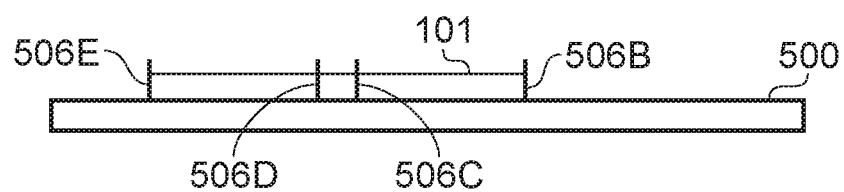
FIG. 27 is a side-view of a current sensor after placement of a coil board on a compensation board during manufacture.
Figure 28:
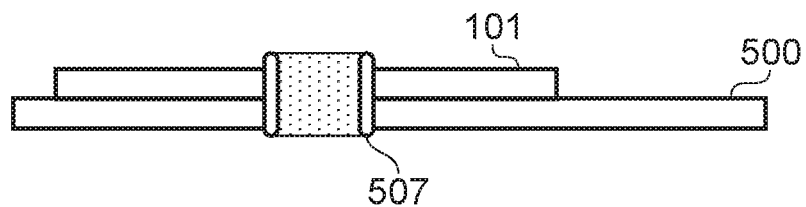
FIG. 28 is a cross-section through a current sensor after placement of an insulating hollow cylinder during manufacture.

A method of manufacturing the current sensing coil 100 will now be described with reference to FIG. 25. As a first step, the conductive tracks and vias forming the current sensing coil 100 are formed on the coil board 101 using standard PCB manufacturing techniques (S2500). Similarly, the compensation wire and solder pads are formed on the compensation board 500 (S2501). Pins 506A to 506H are then formed in the compensation board 500 in positions corresponding to the positions of the castellated vias 103A to 103H (S2502). This is shown in FIG. 26. The coil board 101 is then positioned on the compensation board 500, using the pins 506A to 506H and castellated vias 103A to 103H to properly align the two boards, as shown in FIG. 27 (S2503). A hollow insulating cylinder 507, such as a rubber grommet, is inserted into the openings in the boards, as shown in FIG. 28 (S2504). The purpose of the insulating cylinder 507 is two-fold. Firstly, it insulates the boards from the conductor of interest. Secondly, it holds the boards together during the final reflow soldering step. Finally, the boards are attached at the pin locations using reflow soldering techniques (S2505). This method may also be used when multiple boards are used, such as described above.

In an embodiment, two current sensors may be formed on a single motherboard. In such an arrangement, a single motherboard may comprise two openings, each opening surrounded by a respective compensation wire. Two coil boards, carrying a current sensing coil each, may then be aligned with each compensation wire. Such an arrangement may be used to detect currents in two conductors. For example, the conductors may carry different phases of the same supply.

The invention claimed is:

1. A current sensor comprising:
a first board portion supporting a first current sensing coil, the first current sensing coil formed around an opening in the first board portion using one or more planes, a first compensation wire formed on a second board portion, the first compensation wire formed around an opening in the second board portion and defining a single plane; and
wherein the first board portion is stacked with the second board portion such that their respective openings are aligned, the openings are arranged to receive a current carrying conductor, and the board portions are arranged such that the first current sensing coil and the compensation wire at least partially overlap.

2. A sensor according to claim 1, wherein the first board portion is a double-sided board to provide a first board, and the first current sensing coil comprises a first set of radial elements formed on a first surface of the first board, and a second set of radial elements formed on a second surface of the first board, and the first set of radial elements is coupled to the second set of radial elements by a plurality of vias formed in the first board.

3. A sensor according to claim 2, wherein the first and second sets of radial elements comprises elements of a first length, and elements of a second length, shorter than the first length, and the elements of the first and second length are arranged in an alternating arrangement.

4. A sensor according to claim 1, wherein the first current sensing coil is a toroid.

5. A sensor according to claim 1, further comprising one or more additional boards, each board supporting an additional current sensing coil, the boards stacked to form a series of current sensing coils.

6. A sensor according to any preceding claim, wherein the or each compensation wire comprises a first circular loop, having a circumference substantially aligned with an outer edge of the current sensing coil, and a second circular loop, having a circumference substantially aligned with an inner edge of the current sensing coil, wherein an end of the first loop is coupled to an end of the second loop.

7. A sensor according to claim 1, wherein an end of the or each compensation wire is coupled to a respective end of the first current sensing coil.

8. A sensor according to claim 1, wherein the current sensing coil is a di/dt coil or modified-Rogowski coil.

9. A sensor according to claim 1, wherein the second board portion comprises a second board; and
wherein the first board includes a plurality of castellated vias, arranged to allow the first board to be soldered to the second board.

10. The sensor according to claim 1, wherein the second board portion comprises a second board;
wherein the sensor includes an output, and a signal processing circuit, coupled to the output of the sensor; and
wherein the signal processing circuit is positioned on the first or second boards.

11. The sensor according to claim 1, in combination with at least one other sensor according to claim 1, wherein a board of each sensor is the same board, and each of the at least two sensors is for sensing current in a different current carrying conductor.

12. A method of manufacturing a current sensor; comprising:
providing a first board having an opening formed therein;
forming a first current sensing coil on the first board around the opening in the first board;
providing a second board having an opening formed therein;
forming a first compensation wire on a single, first surface of the second board around the opening in the second board;
attaching the first board to the second board such that that the respective openings are aligned;
wherein the openings are arranged to receive a current carrying conductor, and the boards are arranged such that the first current sensing coil and the first compensation wire at least partially overlap.

13. A method according to claim 12, further comprising:
providing connection vias in an outer edge of the first board, in predetermined locations;
providing pins in the second board, in positions corresponding to the predetermined locations;
wherein the pins and the connection vias are for aligning the first and second boards during the step of attaching the first board to the second board.

14. A method according to claim 13, wherein the step of attaching includes:
placing the boards together such that they are aligned;
providing a hollow insulating cylinder within the openings in the boards; and
providing solder joins at locations around the edges of the boards.

15. A current sensor comprising:
a first board supporting a first current sensing coil, the first current sensing coil formed around an opening in the first board;
a second board;
a first compensation wire formed on a first surface of the second board, the first compensation wire formed around an opening in the second board;
a third board supporting a second current sensing coil, the second current sensing coil formed around an opening in the third board;

a second compensation wire formed on a second surface of the second board, the second compensation wire formed around the opening in the second board, wherein the first board is attached to the second board such that their respective openings are aligned, wherein the openings of the first board and the second board arranged to receive a current carrying conductor, and arranged such that the first current sensing coil and the compensation wire at least partially overlap;

wherein the third board is attached to the second board such that their respective openings are aligned, the openings of the second board and the third board arranged to receive a current carrying conductor, and arranged such that the second current sensing coil and the second compensation wire at least partially overlap; and wherein the first and second current sensing coils are coupled together to produce a differential output.

16. The current sensor according to claim 15, wherein the first current sensing coil includes:

a first set of radial elements formed on a first side of the first board;

a second set of radial elements formed on a second side of the first board; and a plurality of vias, formed in the first board, and arranged to connect ends of the first set of radial elements to respective ends of the second set of radial elements;

wherein each radial element on the first side is aligned with a respective radial element on the second side, such that the respective radial elements form a radial plane which is orthogonal to the surfaces of each side of the first board.

17. The current sensor according to claim 16, wherein the plurality of vias includes a plurality of outer circumferential vias, and outer ends of the radial elements are coupled to the outer circumferential vias by a plurality of substantially circumferential elements which extend from the outer ends of the radial elements to the vias.

18. The current sensor according to claim 16, wherein each set of radial elements comprises elements of a first length, and elements of a second length shorter than the first length, and the elements of the first and second lengths are arranged in an alternating arrangement.

19. The current sensor according to claim 18, wherein the plurality of vias include a plurality of first inner circumferential vias, coupled to the radial elements of a first length, and a plurality of second inner circumferential vias, coupled to the radial elements of a second length.

20. The current sensor according to claim 16, wherein at least one of the radial elements is arranged to form an external connection.

* * * * *